United States Patent [19]

Fujita et al.

[11] 4,023,091
[45] May 10, 1977

[54] APPARATUS FOR DETECTING AXIAL DISPLACEMENTS IN POWER WINDINGS OF ELECTRIC INDUCTION MACHINES

[76] Inventors: Toshio Fujita; Katusada Ishida; Takehiko Funakoshi, c/o Kabushiki Kaisha Meidensha, No. 2-1-17, Ohsaki, Shinagawa, Tokyo, Japan

[22] Filed: Oct. 25, 1975

[21] Appl. No.: 625,159

Related U.S. Application Data

[62] Division of Ser. No. 457,721, April 3, 1974, abandoned.

[30] Foreign Application Priority Data

Apr. 4, 1973 Japan .............................. 48-38966
Apr. 7, 1973 Japan .............................. 48-40129

[52] U.S. Cl. .............................. 324/34 R; 324/55
[51] Int. Cl.$^2$ ...................................... G01R 33/12
[58] Field of Search ................ 324/34 R, 43 R, 47, 324/55

[56] References Cited

UNITED STATES PATENTS 1,901,701  3/1933  Coffin .................................. 324/55

FOREIGN PATENTS OR APPLICATIONS 491,895  2/1930  Germany ............................ 324/55
50,673   2/1966  Poland ................................ 324/55
375,079  3/1964  Switzerland ..................... 324/43 R

OTHER PUBLICATIONS

Lech et al., Detecting Transformer Winding Damage, Elec. Rev., vol. 18, Nov. 1966, pp. 768–772.

*Primary Examiner*—Robert J. Corcoran

[57] ABSTRACT

In an induction machine having power windings disposed coaxially about the iron core thereof, means for reducing an axial mechanical force produced in any given winding by the interaction of the radial components of leakage flux produced at a time of short-circuiting and an electric current flowing in the given winding at that time. The reducing means includes a plurality of loops mounted respectively at the ends of the given winding and adapted to link the radial components of leakage flux produced at the ends of the given winding at the short-circuiting to generate induced currents in said loops. These currents produce magnetic flux for cancelling the radial components of leakage flux, respectively. In order to equalize the quantities of the radial flux components having opposite directions at the given winding to each other to reduce the axial force, one or two search coils are mounted at the ends of the given winding so as to link the radial flux components, respectively and then the windings are axially relatively moved till the difference between the elctromotive forces induced in the search coils becomes zero. If the power windings include a winding of a relatively large radial width, or three or more in number, an auxiliary winding arrangement can be used in order to detect the axial displacements between the electromagnetic median planes of the power windings across the length axes thereof, which planes respectively have equal ampere-turns on either side thereof. The auxiliary winding arrangement is adapted to be disposed coaxially around the outermost power winding and which is adapted to be placed in electromagnetically coupled relationship to a given one of the power windings which is being excited, thereby to produce a magnetic flux having opposed radial components linking the search coils.

7 Claims, 28 Drawing Figures

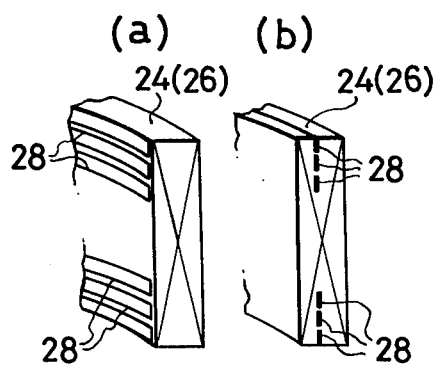
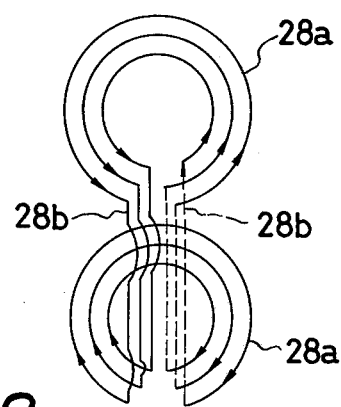
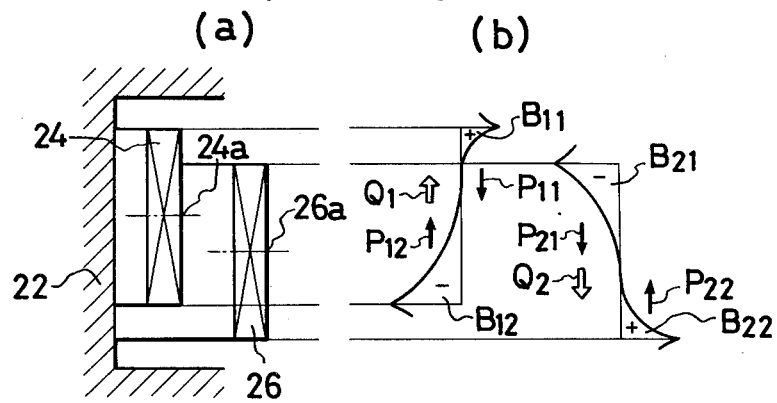
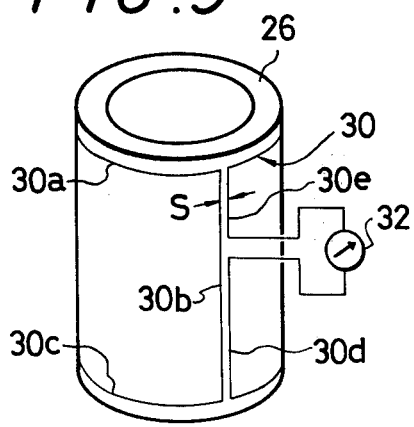
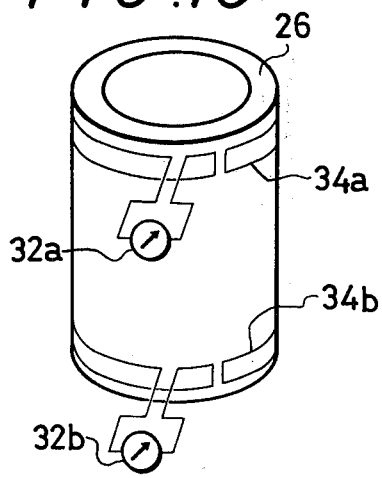

FIG. 16
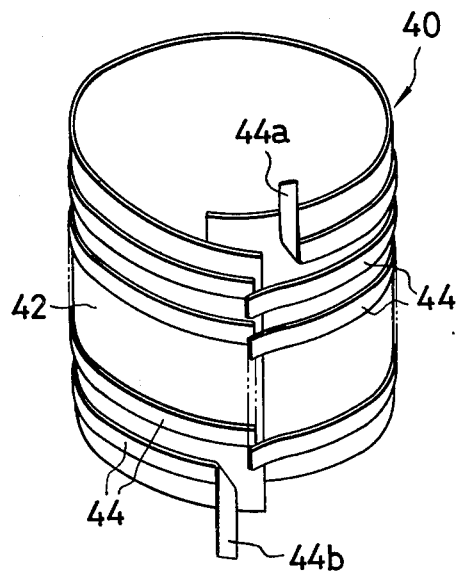
FIG. 18
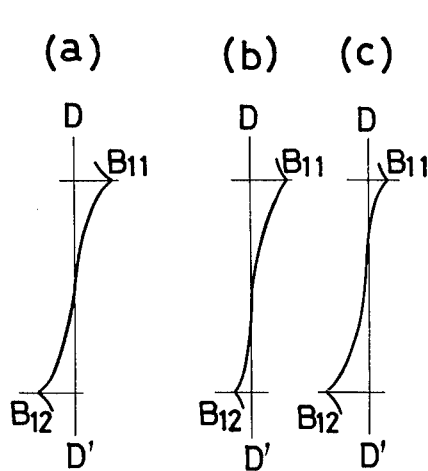
FIG. 17
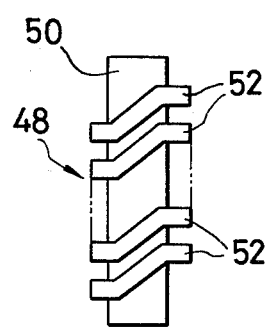
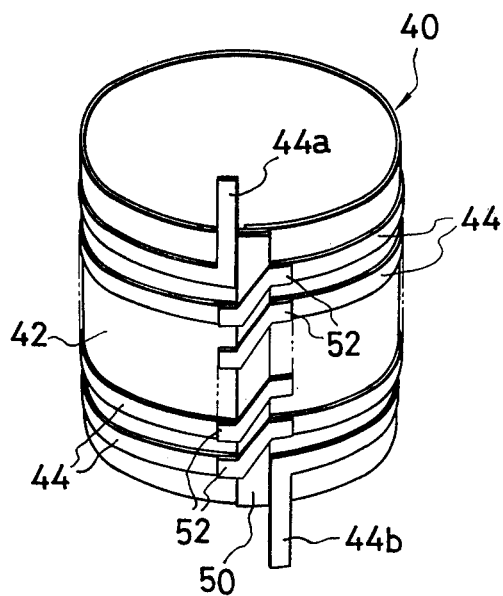

APPARATUS FOR DETECTING AXIAL DISPLACEMENTS IN POWER WINDINGS OF ELECTRIC INDUCTION MACHINES

This is a divisional of the parent application Ser. No. 457,721, filed Apr. 3, 1974, titled "Method Of Reducing An Axial Mechanical Force Exerted On Winding For An Induction Machine And Apparatus Therefor", now abandoned.

This invention relates to an induction machine, and, in particular, improvements in one or more power windings assembled about an iron core of an electric induction machine such as a power transformer.

This invention also relates to a method of reducing an axial mechanical force which will be produced at a time of short-circuiting in one or more power windings wound about an iron core of an electric induction machine.

In an electric induction machine such as a power transformer with for example inner and outer cylindrical windings coaxially wound about an iron core of the machine, when the primary winding, for example, the inner winding is fed with an electric current, it produces a continuous magnetic flux which passes axially through the winding and then turns passing around outside the winding to form a closed path. At the same time, in the outer winding, an induced current flows to produce a magnetic flux having an opposed direction. In each winding are produced radial components of leakage flux which have opposed directions, respectively, and which increase towards the respective ends of the winding. By the interaction of these radial components and the currents flowing in respective windings, there will be produced compressive forces having opposite directions in the respective windings, which point axially internally towards each other. More particularly, these forces act axially internally on coils composing each winding (especially, the forces reach maximum values when a very large current flows in a winding, for example at a short-circuiting) and therefore have an adverse effect on the structural strength and life of the induction machine. Accordingly, in a conventional design of induction machines, it has been required to take various steps by which the windings can withstand those axial forces. In an extreme case, it has been required to enlarge the cross-sectional area of each of coils constituting a winding, or it has been necessary to locally enlarge the cross-sectional area of each of coils constituting a winding disposed particularly at a place where the radial components of leakage flux are large, in order to reduce an eddy-current loss which may be produced by the radial flux components. Furthermore, it has been required to strengthen a structure for connecting the upper and lower yokes of the iron core and a structure for fixing the coils of windings.

When the respective electromagnetic median planes of the inner and outer winding are not coincident with each other, the median plane being across the lengthwise axis of the winding and having equal ampere-turns on either side thereof the distributions of the radial components of leakage flux which are produced in the respective winding and which have opposed directions are not symmetrical with upset to the lengthwise mid points of the windings and there will be a difference between two resultant compressive forces. This difference is a thrust force which presses the coils of the winding in the direction of the thrust force. When a short-circuit occurs on the side of load, a very large current flows through a transformer and so the thrust force increases to a high degree to do damage to the respective windings and therefore the transformer.

The primary and secondary windings generally differ from each other in the ratio of the summed axial length of electric coil conductors to that of the dielectric material therebetween which are occupied in the entire axial lengths of the windings and so, in the fastening process after assembly of the windings on the iron core, both windings are different from each other in axial contraction. Accordingly, it is impossible to maintain the electromagnetic median plane of one winding coincident with that of the other winding.

Since it is almost impossible to wind axially homogeneously coils composing each winding about the core, both electromagnetic median plane of the inner and outer windings can not necessarily be coincident with each other although both axial geographical centers thereof coincide with each other. Thus, in design, it has been required to take measures against the thrust force produced in each winding by taking involved in the manufacturing of the respective windings (the axial displacements between the windings) into consideration. For example, it is required to enlarge the cross-sectional area of a coil conductors, or the number of spacers of dielectric material disposed between the respective coil conductors. Even a small displacement or offset between the electromagnetic median planes of the respective windings generally gives rise to a very large thrust force in each winding at a time of short-circuiting, etc. and accordingly it is now a very important subject to remove the axial displacements between the electromagnetic median planes of the windings.

It is therefore an object of this invention to provide an improved electric induction machine with means for reducing the radial components of leakage flux which may be produced at a time of short-circuiting at the axial ends of the windings would coaxially about the iron core of the induction machine and therefore reducing axial compressive forces which will arise in each winding.

Another object of this invention is to provide a method of sharply reducing the axial compressive forces which may arise in respective power windings would coaxially about the iron core of an electric induction machine at a time of short-circuiting.

A further object of this invention is to provide a method of greatly reducing eddy-currents which may be produced at a time of short-circuiting an respective power windings wound about the iron core of the electric machine.

A still further object of this invention is to provide a method of greatly reducing the radial components of leakage flux which may be produced near the ends of respective power cylindrical windings wound about the iron core of the electric induction machine.

The electric induction machine according to this invention includes closed loops provided around both ends of at least one of substantially cylindrical windings disposed concentrically about the iron core of the machine, said closed loops being adapted to link the radial components of leakage flux thereby to generate at a time of short-circuiting a magnetic flux for cancelling the radial components.

Yet another object of this invention is to provide a method of making electromagnetic median planes of the respective power windings would coaxially about the iron core of the induction machine coincident with each other to reduce the thrust forces produced in the respective windings.

A still further object of this invention is to provide a method of detecting the axial displacements between the electromagnetic median planes of the respective windings wound coaxially about the iron core of the induction machine.

According to this invention, there is provided a method of making coincident the electromagnetic median planes of two cylindrical power windings disposed coaxially with a limb of an iron core of an electric induction machine and with each other, said method comprising the steps of: exciting one of said two cylindrical windings to put the other cylindrical winding in electromagnetically coupled relationship to the former one, thereby causing said other winding to produce a magnetic leakage flux having opposed radial components with opposite signs, and moving a given one of said two windings axially relative to the remaining one to the position where the quantities of the opposed radial components of the leakage flux are equal except for their signs while detecting the difference between the quantities of the opposed radial components of the leakage flux.

However, in the case of an electric induction machine including more than three windings coaxially wound about the iron core of the machine, or in the case of an electric induction machine including two (inner and outer) windings coaxially disposed around the iron core of the machine wherein the outer winding has a relatively large radial width, it is rather difficult to precisely detect the axial displacements between the electromagnetic median planes of the windings by means of one or two serch coils adapted to link the opposed radial components of a magnetic leakage flux produced near the opposite ends of the outermost winding because the percentage of the opposed radial components of the leakage flux linking the search coils is low.

A still further object of this invention is, therefore, to provide an apparatus by which the axial displacements between the electromagnetic median planes of cylindrical power windings disposed coaxially around an iron core of an electric induction machine can be detected precisely if the windings include a winding of a relatively large radial width, or are three or more in number.

The apparatus according to this invention comprises a cylindrical auxiliary winding arrangement disposed coaxially around the outer circumference of the outermost power winding and adapted to be placed in electromagnetically coupled relationship to a given one of said power windings thereby causing said auxiliary winding arrangement to produce a magnetic leakage flux having opposed radial components when said given winding is being excited, means disposed around the outer circumference of said auxiliary winding arrangement for detecting the difference between the quantities of the opposed radial components of the leakage flux, said detecting means including at least one saddle-shaped search coil for linking and detecting the opposed radial components of the leakage flux, said auxiliary winding arrangement and said detecting means being adapted to move together in the axial direction of said cylindrical power windings relative to said power windings, said auxiliary winding arrangement including (a) a dielectric hollow cylindrical member to cover substantially the whole outer surface of said outermost winding, (b) a plurality of circular, equi-sized strips of an electrically conductive material, attached to said dielectric member and equally spaced, parallel to each other, in the axial direction of said outermost winding in surrounding relation thereto, said strips having aligned end and (c) means for respectively electrically connecting one ends of all said strips, but one axially outermost strip, with other ends of the adjacent strips, and for electrically connecting the remaining one end of said one axially outermost strip with the remaining end of the oppositely axially outermost strip to form a closed coil.

FIG. 1(a) is a diagramatical sectional view of an induction machine with the inner and outer windings coaxially wound about the central leg portion of the iron core of the machine, and FIG. 1(b) and 1(c) are diagramatical distribution charts of radial components of leakage flux produced in the inner and outer windings by the electric currents flowing therethrough, respectively, when the electromagnetic median planes of both winding are coincident with each other;

FIG. 2(a) is a diagramatical fragmentary sectional view of an induction machine similar to that shown in FIG. 1(a), wherein the windings have respectively closed loops on the outer surfaces thereof, the loops being adapted to interlink the radial components of leakage flux produced by the electric current flowing through the windings to generate magnetic flux which can cancel the radial flux components, and FIG. 2(b) is a diagramatical fragmentary perspective view of one of the windings which is provided with two closed loops on the upper end of the outer surface thereof, as viewed in the figure;

Figure 1:
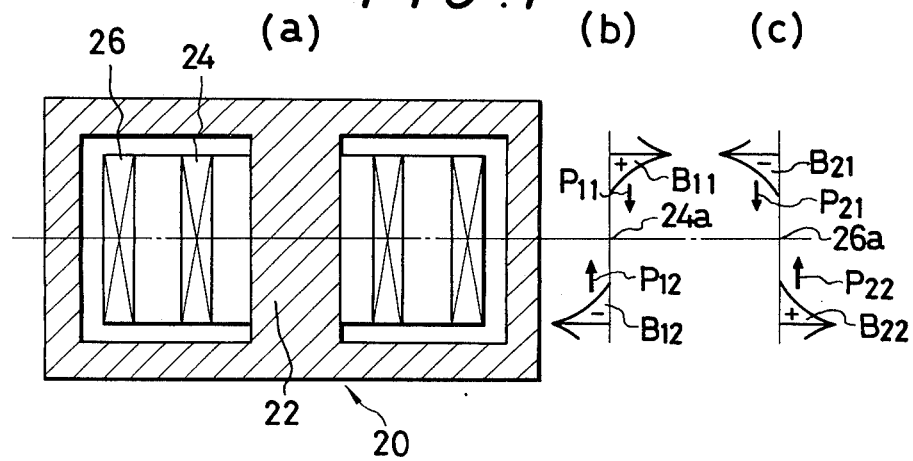
Figures 2, 3:
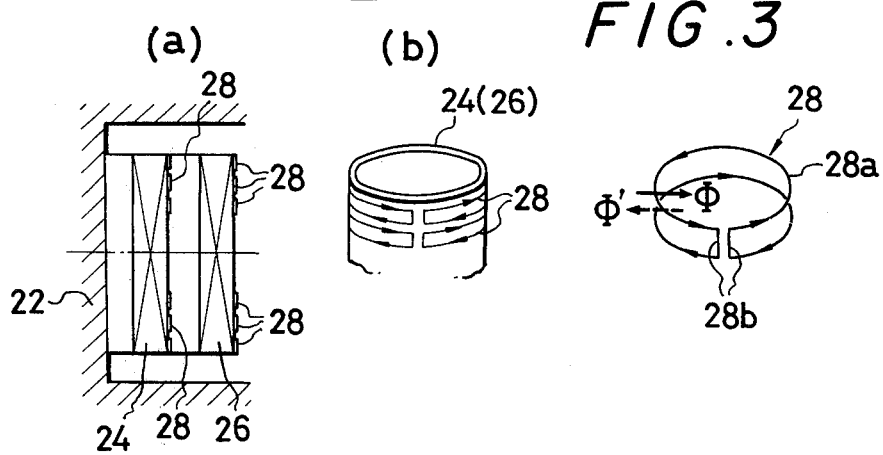
FIG. 3 is an illustration of the principle in which a closed loop generates an induced magnetic flux to cancel the radial component of leakage flux interlinking the look.
Figure 4:
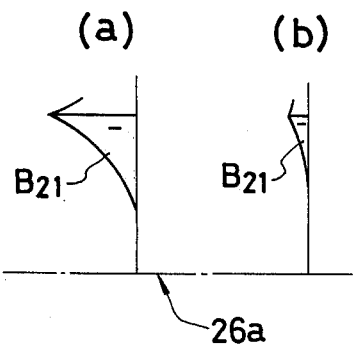
FIG. 4(a) is a diagramatical distribution chart of the upper axial half of the radial component of leakage flux produced in a winding when closed loop is not assembled on the winding.
FIG. 4(b) is a similar chart when the closed loop is assembled, showing the reducing half of the radial component of leakage flux.
Figure 11:
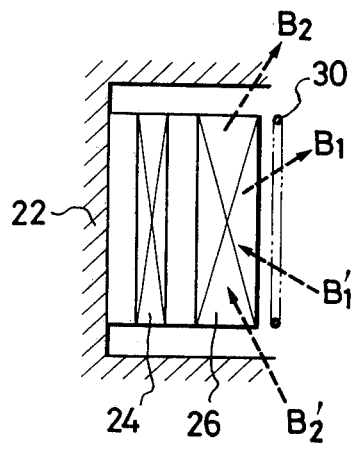
Figure 12:
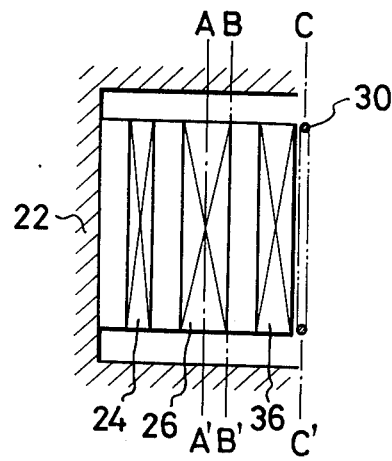
Figure 13:
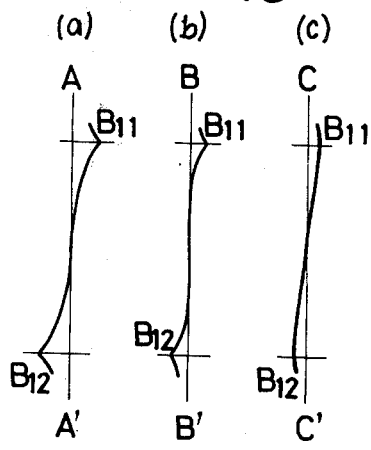
Figure 14:
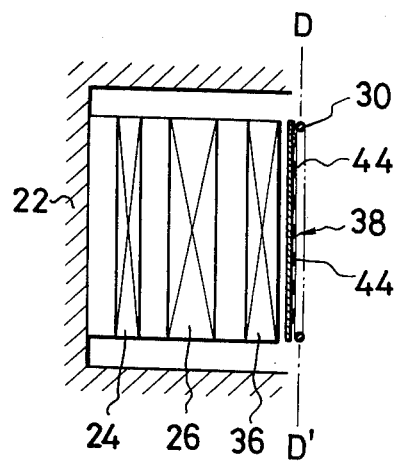
Figure 15:
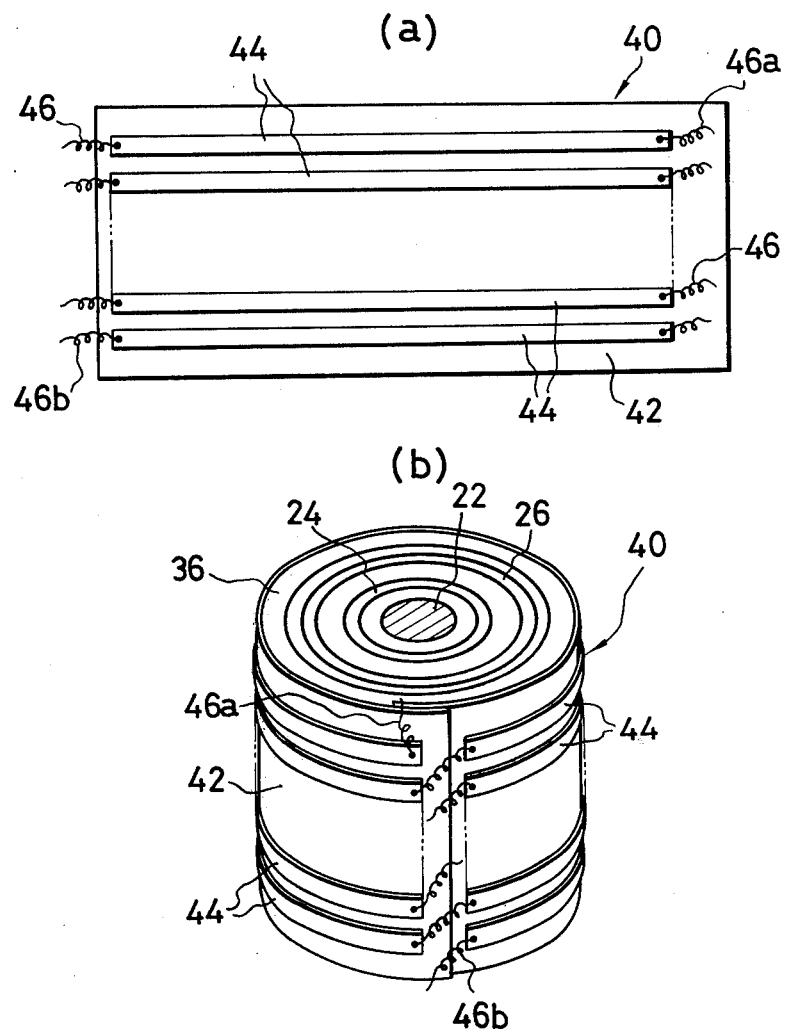

FIG. 6(a) is a diagramatical fragmentary perspective view of a winding wherein a plurality of closed loops such as shown in FIG. 3 are arranged up and down, respectively, around the inner surface of the winding, and FIG. 6(b) is a similar view of a winding wherein a plurality of closed loops such as shown in FIG. 3 are coaxially arranged up and down, respectively, embedded in the wall of the winding;

FIG. 7 is a modification of the closed loop and including a plurality of coil portions which form a coil for reducing the radial component of leakage flux wherein the coil portions are shown in different sizes, respectively, and one group of coil portions are shown eccentrically displaced from the other group of coil portions, for the convenience of illustration;

FIG. 8(a) is a diagramatical fragmentary sectional view of an induction machine similar to that shown in FIG. 1(a), wherein the electromagnetic median planes of the two windings are axially displaced from each other, and FIG. 8(b) and 8(c) are diagramatical distribution charts of the radial components of leakage fluxes produced at excitation in the inner and outer windings, respectively, when electric currents flow therethrough in the case of FIG. 8(a);

FIG. 9 is a diagramatical perspective view of only an outer winding with one saddle shaped search coil mounted thereon and linking the radial components of a magnetic leakage flux at substantially the entire outer surface thereof for detecting an induced electromotive force produced due to the radial component of leakage flux, said coil being associated with an indicator;

FIG. 10 is a view similar to FIG. 9, wherein two discrete search coils are respectively mounted on the end portions of the outer surface of the outer winding and associated with corresponding indicators;

FIG. 11 is a diagramatical fragmentary sectional view of an induction machine similar to that shown in FIG. 1(a), showing that the radial component of a magnetic leakage flux linking a search coil disposed on the outer surface of the outer winding small in quantity by reason of the outer winding being large in radial width;

FIG. 12 is a diagramatical fragmentary sectional view of a three-winding transformer;

FIG. 13 is diagramatical distribution charts of the radial components of leakage flux obtained on lines A-A', B-B' and C-C', respectively, shown in FIG. 12 when the innermost winding is excited and electromagnetically coupled to an intermediate winding;

FIG. 14 is a view similar to FIG. 12, of a three-winding transformer wherein a auxiliary winding is further disposed around the outer circumference of the outermost winding and adapted to interlink the axial magnetic flux produced at excitation of each winding, the auxiliary winding having a saddle-shaped search coil similar to that shown in FIG. 9 on the outer circumference thereof;

FIG. 15(a) is an opened view of an auxiliary winding arrangement for use as the auxiliary winding shown in FIG. 14, wherein a plurality of parallel coil conductors are shown extending longitudinally, and FIG. 15(b) is a diagramatical perspective view a three-winding transformer similar to that shown in FIG. 12, including an auxiliary winding arrangement on the outer circumference of the outermost winding, the coil conductors being respectively connected at their ends to each other by lead wires to form a continuous helical coil;

FIG. 16 is a modification of the auxiliary winding arrangement consisting of a dielectric plate shown as being cylindrically bent and a plurality of coil conductors arranged thereon in parallel with each other;

FIG. 17(a) is a side view of a member for connecting one ends of the coil conductors of the auxiliary winding to the other ends of the adjacent coil conductors respectively, and FIG. 17(b) is a further modification of the auxiliary winding arrangement wherein each of the coil conductors is connected to an adjacent one by the connecting member shown in FIG. 17(a) to form a helical coil;

FIG. 18 is diagramatical distribution charts of the radial components of magnetic flux obtained at excitation on the line D-D shown in FIG. 14 when any auxiliary winding mentioned above is mounted on the outer circumference of outermost winding of the induction machine as shown in FIG. 14, wherein FIG. 18(a) shows that the auxiliary winding and any excited winding are coincident with each other with respect to electromagnetic median plane. FIG. 18(b) shows that the auxiliary winding is displaced downward relative to any excited winding as viewed in FIG. 14, and FIG. 18(c) shows that the auxiliary winding is displaced upward relative to any excited winding as viewed in FIG. 14.

Referring now to FIG. 1(a), there is shown a greatly simplified sectional view of a induction machine such as transformer 20. The transformer 20 includes conventional inner and outer power windings 24, 26 coaxially wound about the leg 22 of the iron core. Of these windings 24 and 26, one forms the primary and the other forms the secondary.

If now one winding such as winding 24 is energized or excited, the other winding such as winding 26 is magnetically coupled to the winding 24, and therefore the radial components of leakage flux induced in the windings increase towards and reach maximums at the respective ends of the windings, as indicated by $B_{11}$, $B_{12}$ and $B_{21}$, $B_{22}$ of FIGS. 1(b) and 1(c). In this case, the radial components of the magnetic flux in each winding present the opposed polarities or directions, respectively, because the magnetic flux induced by the energizing current supplied to the winding has a particular direction. Particularly, in the respective windings, the forces $P_{11}$, $P_{12}$ and $P_{21}$, $P_{22}$ represented by the product of these radial components of leakage flux and the currents flowing in the respective windings are produced and act on the coils composing the respective windings as opposed compressive forces pointing axially internally towards each other. These forces, as mentioned previously, are required to be reduced to a null value because they generate a stress in and therefore have an adverse effect on the coils of each winding.

To guard each winding against it, it is a convenience to provide closed loops around the ends of each winding. This invention has been made in view of the above-mentioned points and the first embodiment of this invention is now described with respect to FIGS. 2 to 7.

In the particular embodiment, as shown in FIGS. 2(a) and 2(b), two groups of closed loops 28 are mounted on the outer surface of each of the inner and outer windings 24 and 26 at the ends thereof respectively, wherein each group of closed loops are axially arranged in parallel with each other and are adapted to link one radial component of leakage flux at a corresponding winding. Each closed loop consists of two circular arc portions 28a of an electric conductor arranged in parallel with each other and corresponding conductors 28b for electrically interconnecting adjacent ends of the upper and lower arc portions 28a.

In the above construction, if the current flows through the windings 24 and 26 shown in FIG. 2(a), the radial component of leakage flux will link each closed loop 28, and as a result the voltage represented by the formulation $$e = -n \frac{d\phi}{dt}$$

(where $n$ is the number of coil turns $\phi$ is radial component of leakage flux and $t$ is time) is induced in each loop 28. The induced voltage presents the induced current flowing in the closed loop 28 for example as illustrated by arrows in FIGS. 2(b) and FIG. 3. Accordingly, as shown in FIG. 3, an induced magnetic flux which has opposite phase to that of the radial component of leakage flux is generated by the induced current in the loop 28.

In FIG. 4(a) is shown one axial half of distribution of the radial component of leakage flux at the winding 26 when no closed loops are provided on the windings 24 and 26, and in FIG. 4(b) is shown a similar distribution of the radial flux component at the same winding 26 when two groups of closed loops are provided in place on the windings 24 and 26, respectively.

In this case, since the flux $\phi'$ acts to cancel the flux $\phi$, the radial components of leakage flux at the respective windings are reduced to small values respectively, as seen from the comparison of FIG. 4(a) with FIG. 4(b).

In this manner, when use is made of closed loops each having a structure such as shown in FIG. 3, it is possible to reduce the radial component of leakage flux at the windings by producing an induced current in each loop to generate an radial magnetic flux having a phase opposed to that of the radial component of leakage flux $\phi$. Accordingly, in this case, there are advantageous that no other power supply is required for feeding an electric current to the loop 28 and that the radial component of leakage flux at the winding 24 or 26 can be reduced.

Figure 5:
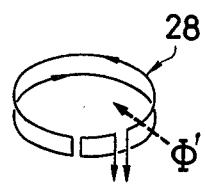
FIG. 5 is an illustration of generating a magnetic flux in a closed loop for canceling the radial component of leakage flux produced in a related winding by forcibly feeding the current flowing through a particular winding to the loop.

In FIG. 5 there is shown another loop which may be used instead of the loop 28 in the first embodiment of this invention. The loop 28 shown in FIG. 5 consists of two parallel circular arc portions and electric wires for electrically interconducting corresponding adjacent ends of both coil portions. When an electric current flows through the inner winding 24 or the outer winding 26, the loop 28 is forcibly fed with the current flowing in the winding to generate a radial flux $\phi'$ having a phase opposed to that of the radial component of leakage flux $\phi$ thereby cancel the flux $\phi$ produced at the windings 24 and 26.

In FIGS. 6(a) and (b), there are shown further modifications of the device of the first embodiment according to this invention. More particularly, the device shown in FIG. 6(a) is provided with two groups of closed loops 28 one group at each end of at least one of the inner and outer winding 24, 26 wherein each group of closed loops 28 are axially arranged in parallel with each other. The device shown in FIG. 6(b) is provided with two groups of closed loops respectively coaxially embedded in the ends of at least one of the inner and outer windings 24, 26, wherein each group of closed loops are axially arranged in the same manner as in the FIG. 6(a).

The closed loop 28 used in the first embodiment may of course be replaced by a closed coil including a plurality of successive coil portions shown in FIG. 7.

As discussed above, according to the method and device in connection with the first embodiment of this invention, the radial components of leakage flux induced in the windings are greatly reduced and so the axial compressive forces acting on each winding and the thrust force defined as the difference between the compressive forces can also greatly be reduced. Accordingly, it is possible not only to remarkably alleviate the necessity of taking measures (for example, to strengthen a core structure, an upper and lower yoke connection structure, and dielectric material disposed between the coils composing each winding, and to enlarge the cross-sectional area of coil conductor) against the axial mechanical forces, but also to increase the mechanical strength of a winding particularly at the occurrence of short-circuiting to provide an induction machine of high reliability.

A still further advantage is that the reduction of the radial component of leakage flux brings about reduction of an eddy current. Accordingly, it is unnecessary to take those steps which enlarge the cross-sectional areas of electrical coil conductors composing the end portions of each winding, and it is possible to enlarge the current density of each winding, thereby reducing the material cost for the machine.

The method and device in connection with a second embodiment of this invention are described with respect to FIG. 8. As is shown in FIG. 8(a), when the inner winding 24 is axially displaced up relative to the outer winding 26 and there is a displacement between the electromagnetic median planes 24a and 26a of both windings 24 and 26, the distributions of the radial components of leakage flux at each of the windings 24 and 26 are unsymmetrical with each other, as shown in FIGS. 8(b) and (c). In this case, although one intends to cancel completely the radial component of leakage flux by disposing two groups of closed loops one group at each end of a winding, the reduced forms of the unsymmetrical distributions of the radial flux components as shown in FIGS. 8(b) and (c) still remain in the windings, respectively. Due to the difference between the unsymmetrical radial flux components, thrust forces having opposed directions are produced at the windings, respectively, which thrust forces are maximum at a short-circuit thereby breaking down the winding structure possibly.

It will easily be realized, for example in FIG. 8, that if there is a relation $|B_{12}| > |B_{11}|$ where the $B_{12}$ and $B_{11}$ are the opposed radial component quantities of leakage flux at of the winding 21 there will be the relation $|P_{12}| > |P_{11}|$ where the $P_{11}$ and $P_{12}$ are opposed axial compressive forces acting on the winding 24 due to the radial component quantities $B_{11}$ and towards $B_{12}$. It will similarly obvious that at the same time, there is a relation, $|B_{21}| > |B_{22}|$ where the $B_{21}$ and $B_{22}$ are the opposed radial component quantities of leakage flux at the winding 26. Therefore, there will be a relation $|P_{21}| > |P_{22}|$ where the $P_{21}$ and $P_{22}$ are oppposed axial compressive forces acting on the winding 26 due to the opposed radial components quantities $B_{21}$ and $B_{22}$.

A thrust force is produced in each winding, which thrust force is the difference between the opposed compressive forces and tends to move the entire winding in the direction of the greater compressive force. Accordingly, since $|B_{11}| < |B_{12}|$, the thrust force $Q_1 = P_{12} - P_{11}$ acts upward on the winding 24 as viewed in FIG. 8(b), while, since $|B_{21}| > |B_{22}|$, the thrust force $Q_2 = P_{21} - P_{22}$ acts downward on the winding 26.

In order to remove the unsymmetricalness of the distributions of the radial components of leakage flux in the windings, it is required to make the electromagnetic median planes of the respective windings coincident with each other, as will be easily understood to those skilled in the art.

Therefore, the second embodiment of this invention concerns a method of removing or greatly reducing a mechanical thrust force defined by the difference between two compressive forces having opposite directions, respectively, produced in a given winding by the interaction of the radial components of leakage flux having opposed directions, respectively, produced a short-circuiting of the side of any one of the windings wound about the iron core of a induction machine and an induced current flowing in the given winding at that time, said method comprising the steps of disposing a search coil relative to said given winding and linking the radial components of leakage flux produced at excitation in the given winding to detect an electromotive force induced in the given winding by means of an indicator associated with the search coil, and moving axially said windings relative to each other till the electromotive force becomes zero.

Shown in FIGS. 9 and 10 is the second embodiment of the present invention. In FIG. 9 a saddle-shaped search coil 30 having a form similar to that of the closed loop mentioned previously is mounted about the outer circumference of the outer winding 26. The search coil 30 consists of a circular arc electric wire portion 30a mounted about the end of the outer winding 26 an circular arc electrical wire portion 30b whose one end is electrically connected to a corresponding end of the wire portion 30a and extending axially downward on the outer surface of the outer winding 26, a second circular arc electric wire portion 30c whose one end is electrically connected to the other end of the electric wire portion 30b and mounted on the outer surface of the outer winding 26 at the lower end thereof, the second circular arc wire portion 30c being similar to the first circular arc wire portion 30a, an electric wire portion 30d whose one end is electrically connected to the other end of the wire portion 30c and extending axially upward on the outer surface of the winding 26, and an electric wire portion 30e whose end is electrically connected to the other end of the first circular arc wire portion 30a and extending axially downward on the outer surface of the winding 26. There is provided a voltmeter 32 whose terminals are respectively electrically connected to the remaining ends of the wires portions 30d and 30e of the search coil 30.

Accordingly, if, as shown in FIG. 8(a), there exits a displacement between the electromagnetic median 24a and 26a of the inner and outer windings 24 and 26, the magnetic flux $B_{21}$ and $B_{22}$ having different quantities and opposed directions, respectively, at excitation, will link the search coil 30 mounted on the outer surface of the outer winding 26 shown in FIG. 9. At this time, an electromotive force directly proportional to the difference between the flux qualities $B_{21}$ and $B_{22}$ is induced in the search coil 30. One can see if there is a displacement between the electromagnetic median planes of both windings 24 and 26 by measuring the electromotive force using the voltmeter 32. Then, if the outer winding 26 is axially moved relative to the inner winding 24 so that the electromotive force induced in the search coil 34 may be zero, the electromagnetic median planes of both windings will coincide with each other and the axially upward and downward forces acting as each winding are balanced with each other, thereby producing no net thrust force.

FIG. 10 shows a modification of the method of detecting and adjusting the axial electromagnetic median planes of the windings wound coaxially about the iron core of the machine, wherein use is made of a pair of saddle-shaped search coils similar to that shown in FIG. 9 and corresponding voltmeters. A pair of search coils 34a, 34b having a structure similar to that shown in FIG. 9 are disposed about the ends of the outer winding 26 where the radial components of leakage flux will be maximum respectively.

The electromotive forces induced in the upper and lower search coils 34a, 34b due to the corresponding radial flux components produced at excitation at the upper and lower ends of the winding 26 are shown in two voltmeters 33a, 32b associated with the search coils 34a, 34b, respectively. Accordingly, if the outer winding 26 is axially moved relative to the inner winding 24 till the difference between the electromotive forces induced in both search coils 34a and 34b becomes zero, the electromagnetic centers 24a, 26a of the windings 24 and 26 will coincide with each other, as in the case of FIG. 9.

In the two embodiments just described, the search coils 30 or 34a, 34b are mounted, for example, on the outer surface of the outer winding 26. However, this invention is not limited to these cases. That is to say, these search coils may be mounted on the inner surface of each winding.

In the embodiments shown in FIG. 9 and 10, the search coils 30 and 34a, 34b are shown as extending substantially the entire circumferential length of the outer surface of the winding 26. However, each search coil may be one including circular arc portions extending a part of the circumferential length of each winding. In other words, the spacing S may be widened between the axially extending wire portions 30b and 30e or 30d of the search coil 30 shown in FIG. 9.

The search coils may be mounted on the inner winding to detect and make coincident the electromagnetic median planes of the respective windings with each other. In order to attain the same purpose, the inner winding may axially be moved relative to the outer winding. The methods described in connection with FIGS. 9 and 10 are applicable to making coincident the electromagnetic median planes of three or more concentric windings which are assembled about an iron core of an induction machine.

As described above, by using the method according to this invention, it is easily possible to detect an remove the axial displacement between the electromagnetic median planes of the windings to substantially a null value, thereby reducing a net axial mechanical force (a thrust force) which may act on a winding as the difference between the compressive forces in the winding. In this case, in this invention, it is only required to axially move one winding for example the outer winding relative to the other winding till the electromotive force induced in a search coil becomes zero, while in the prior art mechanical method, it is required to measure the exact axial displacements between the electromagnetic median planes the respective windings at many points along the respective circumferences of the windings.

According to this invention, there is provided an electric induction machine such as a power transformer in which no net thrust force is produced at short-circuiting and therefore substantially no countermeasures such as taken in the prior art are required against the thrust force produced in each winding.

When the radial width of the outer winding 26 is especially large as shown in FIG. 11, or when three or more windings are used, as shown in FIG. 12, the radial component of leakage flux is small in quantity at the ends of the outer winding 26 or the outermost one 36. More particularly, in FIG. 11, when the inner winding 24 is excited to detect the axial displacement between the electromagnetic median planes of the windings 24 and 26 by means of the search coil 30 provided on the outer circumference of the outer winding 26, the difference between, for example, the leakage flux $B_1$ and $B'_1$ linking the search coil 30 is detected, but for example the leakage flux $B_2$ and $B'_2$ do not link the coil 30. As the radial width of a winding increases, the percentage of the magnetic flux which does not link the search coil 30 such as the leakage flux $B_2$ and $B'_2$ increases.

In the case of a three-winding transformer as shown in FIG. 12, as the search coil 30 is radially distant from an excited winding, the radial component of a magnetic leakage flux which is detected by the search coil 30 decreases. More particularly, shown in FIG. 13 are the radial flux components, for example, on the width center A–A' and on the outer circumference B–B' of the winding 26 and on the outer circumference C–C' of the outermost winding 36, where the search coil 30 is positioned with the windings 26 and 36 being open-circuited. That is to say, the upper and lower quantities of opposed radial flux components $B_{11}$ and $B_{12}$ detected decrease, as shown at (a), (b) and (c) in FIGS. 13, as the position at which the detection is carried out becomes distant from the excited winding 24.

In view of the above, the third embodiment of this invention uses a closed auxiliary winding of a plurality of turns wound about the outer circumference of the outermost winding. When any winding is excited, axial flux produced from the winding links the auxiliary winding to produce an induced current therein. This current further generates a magnetic flux whose radial component links the search coil mounted around the outer circumference of the dummy coil to induce an electromotive force therein, thereby bringing about obtaining an exact measurement of the relative axial displacements of the windings.

The third embodiment of this invention is now described more particularly with reference to FIGS. 14 to 18. Referring to FIG. 14, an auxiliary winding 38 is mounted on the outer circumference of the outermost arrangement one 36 of the three windings assembled about the leg portion 22 of the iron core 20 of the machine. Further, mounted on the auxiliary winding arrangement 38 is a saddle-shaped search coil 30 similar to that shown in FIG. 9.

When the innermost winding 24 is excited with all other windings 26 and 36 being kept open-circuited, it produces a magnetic flux having an axial component which links the auxiliary winding arrangement 38 thereby to produce an induced current therein. The induced current then produces a magnetic flux having opposed radial components which link the search coil 30 thereby to induce an electromotive force therein. This electromotive force is detected by a voltmeter (not shown) associated with the search coil 30. The auxiliary winding arrangement 38 is axially moved together with the search coil 30 relative to the innermost winding 24 until the electromotive force becomes zero, at which position, the electromagnetic median planes of the innermost winding 24 and the auxiliary winding arrangement 38 coincides with each other. Thus, the axial displacement of the auxiliary winding arrangement and therefore the innermost winding 24 from a reference point is discovered. Next, the intermediate winding 26 is excited with all other windings 24 and 36 being kept open-circuited. Thus, the winding 26 is electromagnetically coupled to the auxiliary winding arrangement 38 thereby to make it possible to discover the axial displacement of the intermediate winding 26 from the reference point, in the same way as in the case of the innermost winding 24. In the same way, the axial displacement of the outermost winding 36 from the reference point is discovered. This makes it possible to known the respective magnitudes of the axial displacements between the electromagnetic median planes of all the power windings. Then, the respective power windings will be axially moved toward the reference position by amounts corresponding to the respective magnitudes of the axial displacements thereby to bring about obtaining the coincidence of the electromagnetic median planes of all the power windings.

The auxiliary winding arrangement used in the particular embodiment has, as shown in FIG. 15(a), a coil winding structure 40 including a bendable dielectric plate 42, a plurality of coil conductors i.e. tape-like metallic strips 44 of electrically conductive material for example metallic foils 44 extending longitudinally parallel to with each other and attached to one surface of the plate 42, and corresponding connecting leads 46 connected to the ends of the respective strips 44 for example by soldering or brazing. This winding structure 40 is, as shown in FIG. 15(b), removably mounted around the outer circumference of the outermost winding 36 and then the connecting leads 46 are electrically connected to each other so that the connecting leads at one ends of the strips may be connected to those at the opposite ends of adjacent strips, respectively. The remaining leads 46a and 46b are also electrically connected to each other to form a closed coil.

Use may also be made of a modified winding structure shown at 40 in FIG. 16 and similar to those shown in FIGS. 15(a) and (b) except for the connecting leads 46. As in FIG. 15(b), the winding structure 40 is applied to the outer circumference of the outermost winding, one ends of the strips 44 may electrically be attached to the other ends of adjacent strips, respectively, and the remaining ends 46a and 46b may similarly be attached to each other to form a similar coil. As a third form, a connecting structure 48 shown in FIG. 17(a) may be used for electrically connecting similar strips 44 disposed on the winding structure 40 shown in FIG. 17(b). More particularly, the connecting structure 48 includes a rectangular dielectric base plate 50 and a plurality of connecting strip pieces 52 disposed axially parallel to each other on the base plate 50, each piece being of an electrically conductive material and including a step-like portion to electrically connect one ends of strips 44 to opposite ends of adjacent strips. When the structure 40 is cylindrically bent and mounted around the outer circumference of the outmost winding the connecting structure 48 may be applied between the opposite ends of the curved strips 44, as shown in FIG. 17(b) and the connecting pieces 52 may be connected at the ends to the corresponding ends of the adjacent strips 44, respectively by brazing or soldering to form a similar auxiliary winding.

With the auxiliary winding around the outer circumference of the outermost winding 36, the distribution of the radial component of magnetic flux on the circumferential line D–D' in FIG. 14 where the search coil 30 is positioned appears greater as shown in FIG. 18 then when no auxiliary winding is used, thereby bringing about a more precise detection of the axial displacements between the electromagnetic median planes of the windings.

A curve shown in FIG. 18(a) is a distribution chart obtained when the electromagnetic median planes centers of the innermost winding 24 and the auxiliary winding arrangement 38 coincide with each other and the upper and lower quantities of the radial flux component $B_{11}$ and $B_{12}$ having opposed direction are equal to each other. Accordingly, a null electromotive force is induced in the search circular arc 30 whose coil portions run along the ends of the auxiliary winding arrangement 38. A curve shown in FIG. 18(b) is a similar chart obtained when the electromagnetic median planes of the innermost winding 24 is displaced down relative to that of the auxiliary winding arrangement 38 as viewed in the figure, and FIG. 18(c) is a similar chart obtained when the median plane of the winding 24 is displaced upward relative to that of the dummy coil arrangement 38. In these cases of FIGS. 18(b) and (c), as described previously, there is a difference between the upper and lower flux quantities $B_{11}$ and $B_{12}$, and an electromotive force related to the difference is induced in the search coil 30.

In the particular embodiment, description has been given with respect to a method of detecting and reducing the axial displacements between the electromagnetic planes of the windings by using both of the auxiliary winding and the search coil. However, in this invention, it is possible to indirectly detect the distribution of the radial component of leakage flux as the difference between the axial components quantities of magnetic flux at any two adjacent ones of the curved strips axially spaced along the circumference of the outermost winding.

This method is known as "Volt turn method" including measuring respectively the electromotive forces induced in the respective turns of a winding to obtain the volt difference between any adjacent turns to known the distribution of the radial component of leakage flux. In carrying out this method, it has been required to previously connect a lead for measuring an electromotive force to each coil conductor of a winding, or to pierce two needle-like electrodes into the wire insulation paper of each winding coil. Accordingly, a winding has been in danger of a remarkable degradation of isolation, but according to this invention, a measurement can easily carried out with an auxiliary winding without doing any damage to a winding.

As is clear from the description on the third embodiment, according to this invention, it is possible to detect with a high accuracy the axial displacements between the electromagnets median planes of the windings assembled about the iron core of the induction machine by using an auxiliary winding arrangement having a simple structure and removably mounted on the outer circumference of a winding. For example, in the case of a power transformer having a complicated winding arrangement, it is possible to detect the axial displacements between the electromagnetic median planes of the windings to make the electromagnetic median planes centers of the windings coincident with each other with high precision. Accordingly, there is provided a power transformer where substantially no net axial mechanical force is produced even at a short-circuit and therefore substantially no countermeasure against the axial mechanical force is required. The auxiliary winding arrangement is easy to manufacture and brings about an inexpensive detection of a displacement. In order to apply the volt turn method, needle-like measuring electrodes may be used to pierce the strips disposed on the dielectric plate according to this invention.

This invention has been described with respect to the embodiments of substantially cylindrical windings concentrically wound about the iron core of the induction machine, but this invention is not limited to these embodiments. This invention is applicable to a so called interleaved winding type induction machine including primary and secondary windings disposed axially alternately spaced from each other about the leg portion of the iron core of the machine. The problem in this case is to adjust the radial electromagnetic centers of the primary and secondary windings. To this end, it is required to dispose a search coil associated with a voltmeter on a radially extending surface of each winding so that the coil may link the axial component of leakage flux to detect the displacements between electromagnetic centers the windings. The search coil may include two circular arcs of an electrically conductive material arranged concentrically in a plane and two electric wires for electrically connecting the adjacent ends of the different circular arcs with each other, respectively, to form a closed coil.

Since many changes could be made in the above construction and may apparently widely different embodiments of this invention could be made without departing from the scope thereof, it is intended that all matter contained in the above description or shown in the accompanying drawings shall be interpreted as illustrative and not in a limiting sense.

What we claim is:

1. An apparatus for detecting the axial displacements between the electromagnetic median planes of a plurality of cylindrical power windings (24, 26, 36 in FIG. 14) disposed coaxially about an iron core of an electric induction machine and with each other, the median plane being defined as extending across the lengthwise axis of said windings and which has equal ampere-turns on either side thereof, the apparatus comprising: a cylindrical auxiliary winding arrangement (38) disposed coaxially around the outer circumference of the outermost power winding (36), and adapted to be placed in electromagnetically coupled relationship to a given one of said power windings, thereby causing said auxiliary winding arrangement to produce a magnetic leakage flux having opposed radial components with opposite signs when said given winding is excited; means disposed around the outer circumference of said auxiliary winding arrangement for detecting the difference between the quantities of the opposed radial components of the leakage flux, said detecting means including at least one saddle-shaped search coil (30 in FIG. 14) for linking and detecting the opposed radial components of the leakage flux, said auxiliary winding arrangement and said detecting means being movable together in the axial direction of said power windings relative to the latter; said auxiliary winding arrangement including (a) a dielectric hollow cylindrical member (42) to cover substantially the whole outer surface of said outermost winding, (b) a plurality of circular, equi-sized strips (44) of an electrically conductive material, attached to said dielectric member and being equally spaced and parallel to each other in the axial direction of said outermost winding in surronding relation thereto, said strips having aligned ends, and (c) means (46, 46a, 46b in FIG. 15) for respectively electrically connecting one ends of all said strips, but one axially outermost strip (44b), with other ends of the adjacent strips, and for electrically connecting the remaining one end of said axially outermost strip with the remaining end of the oppositely axially strip (44a) to form a closed coil.

2. The apparatus as defined in claim 1, wherein said detecting means includes a single coil surrounding a portion of an outer surface of said outermost winding, which portion has an axial with equal to substantially the whole axial width of said outermost winding.

3. The apparatus as defined in claim 1, wherein said detecting means includes a pair of equi-sized coils surrounding symmetrical portions of an outer surface of said outermost winding, which portions are spaced at an equal distance from opposite ends of said outermost winding.

4. The apparatus as defined in claim 1, wherein said strips are made of a metallic foil.

5. The apparatus as defined in claim 1, wherein said connecting means include at least one electric lead wire.

6. The apparatus as defined in claim 1, wherein said connecting means include extended ends of said strips.

7. The apparatus as defined in claim 1, wherein said connecting means include a dielectric plate disposed between the said ends and said other ends of the strips, and electrically conductive strip pieces arranged parallel on said plate, said strip pieces being electrically connected respectively at their one ends with said one ends of all the strips, but said axially outermost strip, and at their other ends with said other ends of the adjacent strips, but said oppositely axially outermost strip.

* * * * *